United States Patent
Matsuki et al.

(10) Patent No.: US 7,473,443 B2
(45) Date of Patent: Jan. 6, 2009

(54) COMPOSITION FOR FORMING SILICON FILM AND METHOD FOR FORMING SILICON FILM

(75) Inventors: Yasuo Matsuki, Tokyo (JP); Haruo Iwasawa, Tokyo (JP); Hitoshi Kato, Tokyo (JP)

(73) Assignee: JSR Corporation, Tokyo (JP)

( * ) Notice: Subject to any disclaimer, the term of this patent is extended or adjusted under 35 U.S.C. 154(b) by 610 days.

(21) Appl. No.: 10/515,728

(22) PCT Filed: Aug. 15, 2003

(86) PCT No.: PCT/JP03/10380

§ 371 (c)(1),
(2), (4) Date: Nov. 26, 2004

(87) PCT Pub. No.: WO2004/019393

PCT Pub. Date: Mar. 4, 2004

(65) Prior Publication Data
US 2005/0145163 A1 Jul. 7, 2005

(30) Foreign Application Priority Data

Aug. 23, 2002 (JP) ............................. 2002-243004
Dec. 26, 2002 (JP) ............................. 2002-376019

(51) Int. Cl.
B05D 3/06 (2006.01)
B05D 3/02 (2006.01)

(52) U.S. Cl. .................... 427/452; 427/487; 427/493; 427/563; 427/578; 427/387; 427/397.7; 427/398.1; 427/402

(58) Field of Classification Search .............. 427/578, 427/387, 397.7, 402, 419.7, 452, 497, 493, 427/563, 398.1
See application file for complete search history.

(56) References Cited

U.S. PATENT DOCUMENTS

| 4,377,564 A | * | 3/1983 | Dahlberg .................... 423/349 |
| 4,690,797 A |   | 9/1987 | Eyer et al. |
| 5,866,471 A |   | 2/1999 | Beppu et al. |
| 6,086,945 A |   | 7/2000 | Kamata et al. |

(Continued)

FOREIGN PATENT DOCUMENTS

EP   1 085 560 A1   3/2001

(Continued)

OTHER PUBLICATIONS

Mizuta et al, American Ceramic Society Bulletin, 61(8), pp. 872-875, 1982.*

(Continued)

*Primary Examiner*—Erma Cameron
(74) *Attorney, Agent, or Firm*—Oblon, Spivak, McClelland, Maier & Neustadt, P.C.

(57) ABSTRACT

There are provided a silicon-film-forming composition containing silicon particles and a dispersion medium and a method for forming a silicon film by forming a coating film of the silicon-film-forming composition on a substrate and subjecting the coating film to instantaneous fusion, a heat treatment or a light treatment. According to the composition and the method, a polysilicon film with a desired thickness which may be used as a silicon film for a solar battery can be formed efficiently and easily.

12 Claims, 1 Drawing Sheet

U.S. PATENT DOCUMENTS

| | | | |
|---|---|---|---|
| 6,527,847 B1 * | 3/2003 | Matsuki | 106/287.1 |
| 6,541,354 B1 | 4/2003 | Shimoda et al. | |
| 2001/0021760 A1 * | 9/2001 | Matsuki et al. | 528/10 |

FOREIGN PATENT DOCUMENTS

| | | | |
|---|---|---|---|
| EP | 1 284 306 A2 | | 2/2003 |
| GB | 2 077 710 | | 12/1981 |
| JP | 49-046196 | * | 5/1974 |
| JP | 1-29661 | | 1/1989 |
| JP | 1-110776 | | 4/1989 |
| JP | 01-110776 | | 4/1989 |
| JP | 06-116704 | * | 4/1994 |
| JP | 7-267621 | | 10/1996 |
| JP | 10-045409 | * | 2/1998 |
| JP | 2001-185088 | | 7/2001 |
| JP | 2001-308020 | | 11/2001 |
| TW | 00465131 | | 11/2001 |
| WO | WO 00/58409 | * | 10/2000 |
| WO | WO 00/59015 | | 10/2000 |

OTHER PUBLICATIONS

Svrcek et al, Materials Science and Engineering C, 19(1-2), pp. 233-236, Jan. 2002.*

Kern, Werner et al. "Advances in deposition processes for passivation films", J. Vac. Sci. Techno., vol. 14, No. 5, pp. 1082-1099 1977.

Spear, W.E. et al. "Substitutional Doping of Amorphous Silicon", Solid State Communications, vol. 17, pp. 1193-1196 1975.

* cited by examiner

COMPOSITION FOR FORMING SILICON FILM AND METHOD FOR FORMING SILICON FILM

TECHNICAL FIELD

This invention relates to a composition for forming a silicon film and a method for forming a silicon film. More specifically, the present invention relates to a silicon-film-forming composition containing specific silicon particles and a method for forming a polysilicon film by use of the composition.

BACKGROUND ART

As a method for forming an amorphous silicon film or polysilicon film used in production of a solar battery, a thermal CVD (Chemical Vapor Deposition) method using a monosilane or disilane gas, plasma CVD method or optical CVD method has heretofore been employed. In general, the thermal CVD method (refer to J. Vac. Sci. Technology., Vol. 14, p. 1082 (1977)) is widely used to form the polysilicon film, and the plasma CVD method (refer to Solid State Com., Vol. 17, p. 1193 (1975)) is widely used to form the amorphous silicon film.

However, the formation of the silicon films by these CVD methods has problems that since a gas phase reaction is used, the contamination of equipment and/or production of foreign materials are/is caused by by-production of silicon particles in the gas phase, thereby lowering a production yield, that since the raw material is in gaseous form, it is difficult to form a silicon film having a uniform film thickness on a substrate having an uneven surface, that productivity is low due to a low film formation rate and that complex and expensive high frequency generator and vacuum device are required in the plasma CVD method. Therefore, further improvements in these CVD methods have been waited.

As for the raw material, since gaseous silicon hydride which is highly toxic and reactive is used, it is difficult to handle, and a sealable vacuum device is required since the raw material is in gaseous form. In general, these devices are large and expensive and also cause an increase in production costs since they consume a large amount of energy for a vacuum system or a plasma system.

Meanwhile, in recent years, a method of coating liquid silicon hydride without using the vacuum system has been proposed. JP-A 1-29661 (the term "JP-A" as used herein means an "unexamined published Japanese patent application") discloses a method of forming a silicon-based thin film by causing a gaseous raw material to liquefy and adsorb on a cooled substrate and react with chemically active atomic hydrogen. However, this method has problems that a complex device is required since gasification and cooling of silicon hydride as the raw material are carried out successively and that it is difficult to control the thickness of the film.

Further, JP-A 7-267621 discloses a method of coating low-molecular-weight liquid silicon hydride to a substrate. However, this method is difficult to use since the system is unstable, and since the raw material is in liquid form, it is difficult to obtain a uniform film thickness when it is coated on a substrate with a large area.

Meanwhile, an example of a solid silicon hydride polymer is reported in British Patent GB-2077710A. However, a film cannot be formed by a coating method since the polymer is insoluble in a solvent.

Further, a polysilicon film for use in a solar battery and the like is produced primarily by a method comprising the steps of forming an amorphous silicon film by the thermal CVD method (for example, J. Vac. Sci. Technology., Vol. 14, p. 1082 (1977)) using a monosilane or disilane gas as a raw material or the plasma CVD method (for example, Solid State Com., Vol. 17, p. 1193 (1975)) and then converting the amorphous silicon film into a polysilicon film by laser annealing, a hydrogen plasma treatment or other treatment. The formation of the silicon film by use of the thermal or plasma CVD method has problems that:

(1) since a gas phase reaction is used, silicon particles are produced in the gas phase and cause the contamination of equipment and/or production of foreign materials, thereby lowering a production yield, (2) since the raw material is in gaseous form, it is difficult to form a silicon film having a uniform thickness on a substrate having an uneven surface, (3) productivity is low due to a low film formation rate, and (4) complex and expensive high frequency generator and vacuum device are required in the plasma CVD method. Therefore, further improvements in these CVD methods have been waited.

DISCLOSURE OF THE INVENTION

An object of the present invention is to solve the above problems of the prior art and provide a composition and method for forming a polysilicon film having a desired film thickness efficiently and easily.

Other objects and advantages of the present invention will become apparent from the following description.

According to the present invention, firstly, the above object and advantage of the present invention are achieved by a silicon-film-forming composition comprising silicon particles and a dispersion medium.

Further, secondly, the above object and advantage of the present invention are achieved by a method for forming a silicon film which comprises the steps of forming a coating film of the above silicon-film-forming composition on a substrate and subjecting the coating film to instantaneous fusion, a heat treatment or a light treatment.

DETAILED DESCRIPTION OF THE PREFERRED EMBODIMENT

Figure 1:
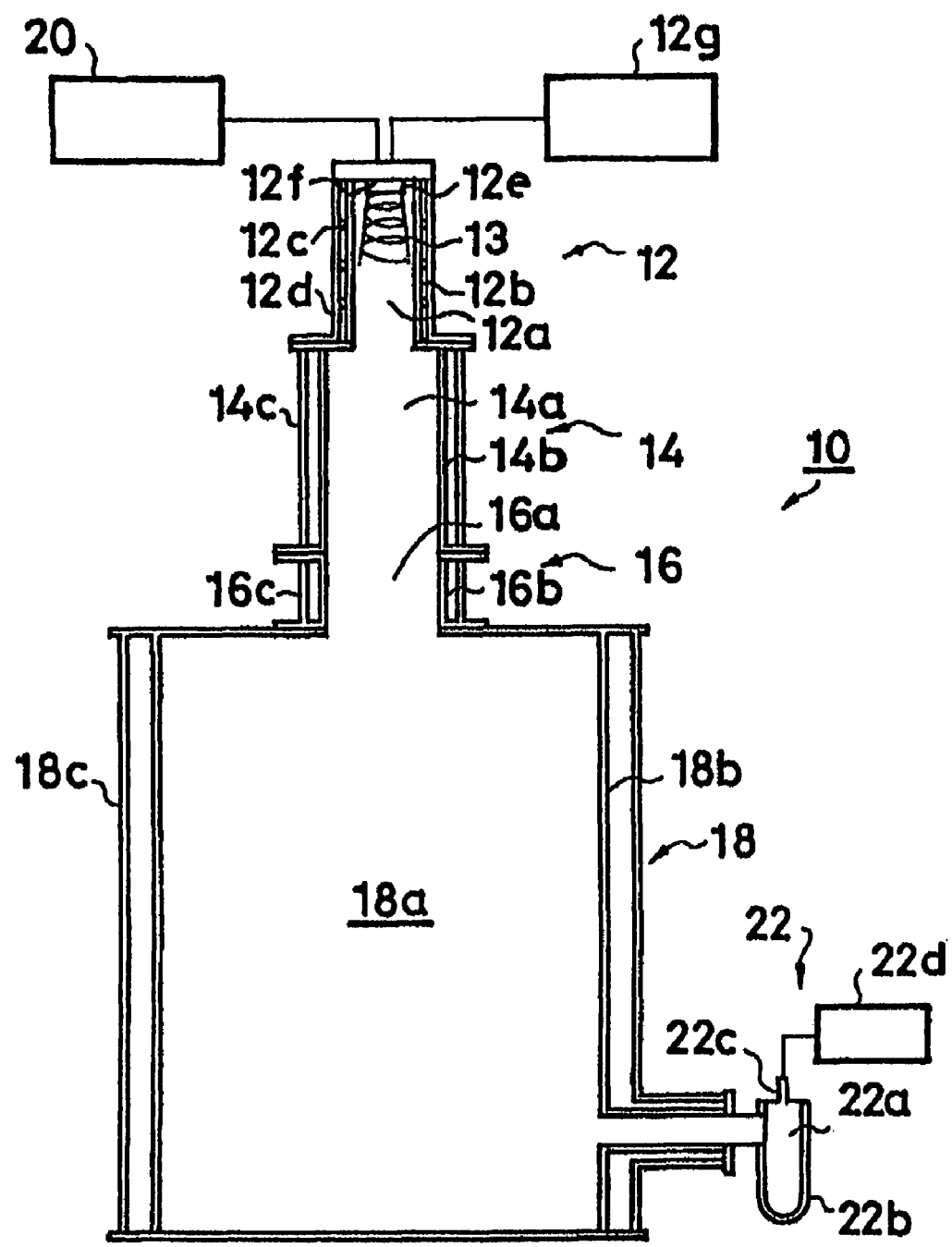
FIG. 1 is an explanatory diagram showing the cross sectional constitution of thermal plasma treatment equipment for producing silicon particles which is used in the present invention.

Hereinafter, the present invention will be described in detail.

A silicon-film-forming composition of the present invention comprises silicon particles and a dispersion medium.

The above silicon particles may be any silicon particles as long as the object and effect of the present invention are not impaired. However, they are polycrystalline or monocrystalline and are preferably of high purity. Such silicon particles can be produced by, for example, grinding polycrystalline or monocrystalline silicon ingot and can be produced by subjecting the thus ground silicon to a thermal plasma treatment. Illustrative examples of ingots which can be used for producing the silicon particles include a high-purity i-type silicon ingot, a high-purity n-type silicon ingot and a high-purity p-type silicon ingot.

The above i-type silicon ingot is preferably of high purity and preferably has a purity of not lower than 99.99%, more preferably not lower than 99.9999%, for example.

The above n-type silicon ingot may be doped with, for example, a nitrogen atom, a phosphorus atom or an arsenic atom. Of these doping atoms, the phosphorus atom is preferred. The amount of doping is generally about $10^{10}$ to $10^{21}$ atom/cm$^3$, preferably $10^{15}$ to $10^{20}$ atom/cm$^3$. With a doping amount of the above range, a silicon film to be formed can be an n-type semiconductor film showing suitable electric properties.

The above p-type silicon ingot may be doped with, for example, a boron atom or a gallium atom. Of these doping atoms, the boron atom is preferred. The amount of doping is generally about $10^{10}$ to $10^{21}$ atom/cm$^3$, preferably $10^{15}$ to $10^{20}$ atom/cm$^3$. With a doping amount of the above range, a silicon film to be formed can be a p-type semiconductor film showing suitable electric properties.

To grind the above silicon ingots, dry grinding or wet grinding may be employed.

When ground silicon is used as the silicon particles of the present invention, it is convenient to use a method comprising the steps of pre-grinding the ingot to appropriate sizes by dry grinding and then wet-grinding the pre-ground silicon by use of a dispersion medium to be contained in the silicon-film-forming composition of the present invention, because the resulting product can be directly used as the silicon-film-forming composition of the present invention after completion of the grinding.

The above dry grinding can be carried out in accordance with a known method by use of a chip crusher, a hammer crusher, a cutter mill or the like. In such pre-grinding, it is convenient for subsequent steps that the particle diameters of silicon particles are preferably about 10 to 500 μm, more preferably about 50 to 300 μm.

The silicon particles are preferably cleaned between the end of the above dry grinding and the start of the above wet grinding by use of an appropriate cleaning agent. By this washing treatment, compounds resulting from degeneration of silicon, such as silicon oxide formed on the surfaces of the silicon particles during the dry grinding, and foreign materials such as metals and metal compounds mixed in during the grinding can be removed, whereby the silicon particles to be contained in the composition of the present invention can be of higher purity. For the above cleaning treatment, an RCA cleaning method (refer to RCA Review, 1970 (June), p187) or a cleaning method using an appropriate cleaning agent such as aqua regia or a hydrofluoric acid solution can be employed, for example. Further, these methods can be used in combination.

The above wet grinding can be carried out in accordance with a known method by use of a bead mill, a ball mill, a high pressure liquid impact type mill or the like. As a medium used in the wet grinding, the dispersion medium to be contained in the composition of the present invention can be used. The dispersion medium will be described later.

The particle diameters of the silicon particles after the wet grinding can be adjusted to the particle diameters of the silicon particles to be contained in the silicon-film-forming composition of the present invention.

The particle diameters of the silicon particles to be contained in the silicon-film-forming composition of the present invention can take any values according to a desired film thickness and the like. For example, they may be preferably 0.001 to 20 μm, more preferably 0.005 to 10 μm, much more preferably 0.01 to 5 μm.

Further, when ground silicon is further subjected to a thermal plasma treatment so as to be used as the silicon particles of the present invention, the ground silicon can be obtained by grinding such a silicon ingot as described above by an arbitrary method such as dry grinding or wet grinding in the same manner as described above. In some cases, a method can be employed in which the ingot is pre-ground to appropriate sizes by the dry grinding and then dry-ground or wet-ground by use of the dispersion medium.

The above dry pre-grinding can be carried out in accordance with a known method by use of a chip crusher, a hammer crusher, a cutter mill or the like. In such pre-grinding, it is convenient for subsequent steps that the particle diameters of silicon particles are preferably about 10 to 5,000 μm, more preferably about 50 to 1,000 μm.

When dry grinding is further carried out after the above dry pre-grinding, the dry grinding can be carried out in accordance with a known method by use of a bead mill, a ball mill or the like. Meanwhile, when wet grinding is carried out after the above dry pre-grinding, the wet grinding can be carried out in accordance with a known method by use of a bead mill, a ball mill, a high pressure liquid impact type mill or the like. As a medium used in the wet grinding, the dispersion medium to be contained in the composition of the present invention can be used. The dispersion medium will be described later.

After completion of the above grinding treatment, the silicon particles are preferably cleaned by use of such an appropriate cleaning agent as described above due to the same reason as described above.

The average particle diameter of the above ground silicon to be subjected to the thermal plasma method is generally 0.01 to 1,000 μm, preferably 0.1 to 100 μm, more preferably 1 to 30 μm.

The thus obtained ground silicon is subjected to the thermal plasma treatment.

That is, the thus obtained ground silicon is sent to a thermal plasma treatment step. For the thermal plasma treatment, thermal plasma treatment equipment described in JP-A 2000-219901 can be used, for example.

Thermal plasma treatment equipment 10 shown in FIG. 1 comprises a plasma torch 12 which has a plasma chamber 12a, a quartz double pipe 14, a cooling double pipe 16, a quenching pipe 18, a ground silicon supplying device 20, and a product recovering section 22.

The plasma torch 12 comprises a quartz pipe 12b which constitutes the plasma chamber 12a in which thermal plasma (plasma flame) 13 is produced, a high frequency transmitting coil 12c which is attached to the outside of the quartz pipe 12b, a cooling jacket pipe 12d which is attached to the outside of the high frequency transmitting coil 12c, a gas ejection port 12e which is provided in the upper portion of the quartz pipe 12b and ejects a gas for plasma in a tangential direction, an axial direction and a radial direction, and a supply port 12f for supplying ground silicon to the thermal plasma 13 formed in the plasma chamber 12a. The plasma torch 12 is a double pipe comprising the quartz pipe 12b and the jacket pipe 12d with the coil 12c interposed therebetween. However, the coil 12c may be attached to the outside of the jacket pipe 12d. Further, the plasma torch 12 may be constituted by three or more pipes and is not particularly limited in size. Further, the plasma gas ejecting directions of the gas ejection port 12e are not limited to three directions, and the gas may be ejected in various directions.

The gas ejection port 12e is connected to one or more gas supply sources 12g at the external top of the plasma torch 12. When a gas for plasma is supplied from the gas supply source 12g to the gas ejection port 12e, the gas for plasma is ejected from the gas ejection port 12e into the plasma chamber 12a in the above three directions. The ejected gas for plasma is formed into plasma by the high frequency transmitting coil 12c to which a high frequency voltage is applied from a high frequency (RF) power source and forms thermal plasma 13 in the plasma chamber 12a of the plasma torch 12. The gas for plasma supplied from the gas ejection port 12e is limited to a noble gas such as argon or helium, a gas such as hydrogen or nitrogen or a mixed gas thereof. The amount of the above gas supplied from the gas ejection port 12e can be selected as appropriate according to the size of the plasma chamber 12a, the characteristics of the thermal plasma 13 and the amount of ground silicon. The high frequency (frequency) and voltage (or electric power) of the high frequency voltage applied to the high frequency transmitting coil 12c are not particularly limited and can be selected as appropriate according to the characteristics of the thermal plasma 13 such as a temperature.

The temperature of the thus formed thermal plasma 13 is required to be equal to or higher than the boiling point of the silicon because the thermal plasma must gasify the ground silicon.

The higher the temperature of the thermal plasma 13, the more easily the ground silicon can be gasified. Thus, the higher the temperature of the thermal plasma 13, the more preferable it is. However, the temperature of the thermal plasma 13 is not particularly limited.

Specifically, the temperature of the thermal plasma 13 may be, for example, 6,000° C. or higher. Meanwhile, the upper limit of the temperature of the thermal plasma 13 is also not particularly limited and is difficult to measure and is therefore difficult to set the upper limit. However, it is conceived that the upper limit reaches around 10,000° C. in theory.

Further, the atmosphere of the thermal plasma 13 is also not particularly limited but is preferably an atmosphere not higher than an atmospheric pressure, i.e., an atmospheric pressure atmosphere or reduced pressure atmosphere. The atmosphere not higher than the atmospheric pressure of the thermal plasma 13 is not particularly limited but is preferably 200 Torr to 600 Torr.

The ground silicon supply port 12f is also connected to the ground silicon supplying device 20 at the external top of the plasma torch 12. The ground silicon is carried by a carrier gas from the supplying device 20 to the supply port 12f and introduced into the thermal plasma. The carrier gas for carrying the ground silicon is limited to a noble gas such as argon or helium, a gas such as hydrogen or nitrogen or a mixed gas thereof. The gas for plasma or a portion thereof (one or more gases before mixing) may be used as the carrier gas for carrying the ground silicon. The ground silicon thus introduced into the thermal plasma 13 is heated by the heat of the thermal plasma 13 and gasified instantaneously. In the thermal plasma 13, the ground silicon exists in a gaseous state. The amount of the ground silicon supplied from the supply port 12f and the kind and amount of the carrier gas which carries the ground silicon are also not particularly limited and can be selected as appropriate according to the characteristics of the thermal plasma 13 and the amount of the ground silicon.

The quartz double pipe 14 is provided under the plasma torch 12 and has a quartz pipe 14b which has a slightly larger diameter than that of the quartz pipe 12b of the plasma torch 12 and a cooling jacket pipe 14c which is provided outside the quartz pipe 14b. The quartz pipe 14b constitutes a cooling chamber 14a which derives the ground silicon gasified by the thermal plasma 13 from the thermal plasma 13 and subjects the silicon gas to primary cooling. The cooling double pipe 16 is provided under the quartz double pipe 14 and has an inner pipe 16b which has nearly the same diameter as that of the quartz pipe 14b of the quartz double pipe 14 and a cooling jacket pipe 16c which is provided outside the inner pipe 16b. The inner pipe 16b constitutes a cooling chamber 16a which further subjects the gaseous, liquid or solid silicon which has been subjected to the primary cooling in the quartz double pipe 14 to secondary cooling.

The quenching pipe 18 is provided under the cooling double pipe 16 and has an inner pipe 18b which has a significantly larger diameter than that of the quartz pipe 16b of the cooling double pipe 16 and a cooling jacket pipe 18c which is provided outside the inner pipe 18b. The inner pipe 18b constitutes a silicon particle producing chamber 18a which quenches the gaseous, liquid or solid silicon which has been subjected to the secondary cooling in the cooling double pipe 16 so as to produce silicon particles to be used in the present invention. In the silicon particle producing chamber 18a of the quenching pipe 18, the gaseous or liquid silicon subjected to the secondary cooling in the cooling double pipe 16 is quenched, thereby producing finer silicon than solid ground silicon, i.e., thermal-plasma-treated silicon particles to be used in the present invention, directly from the gaseous or liquid silicon.

The atmosphere inside the silicon particle producing chamber 18a of the quenching pipe 18 for quenching the gaseous or liquid silicon is preferably an inert atmosphere or a reducing atmosphere so as to suppress or prevent oxidation of silicon, i.e., production of an oxide of metal silicon. The inert atmosphere and the reducing atmosphere are not particularly limited. Illustrative examples thereof include an atmosphere comprising at least one inert gas selected from argon (Ar), helium (He) and nitrogen ($N_2$) and atmospheres comprising hydrogen ($H_2$) and these inert gases. Specific examples of the inert atmosphere include noble gas atmospheres such as an argon atmosphere and a helium atmosphere, a nitrogen gas atmosphere, and a mixed gas atmosphere comprising argon or helium and a nitrogen gas, and specific examples of the reducing atmosphere include a hydrogen-containing argon atmosphere, a hydrogen-containing helium atmosphere, and a hydrogen-containing nitrogen gas atmosphere. Further, the degree of reducibility of the reducing atmosphere is also not limited. Furthermore, although the quartz double pipe 14, the cooling double pipe 16 and the quenching pipe 18 also have a double pipe structure as in the case of the plasma torch 12, the present invention is not limited to the particular structure. Each of these pipes may be constituted by three or more pipes and is also not particularly limited in size.

The product recovering section 22 is a section where thermal-plasma-treated silicon particles produced in the silicon-particle-producing chamber 18a of the quenching pipe 18 are recovered and is provided on the exterior of the lower portion of the quenching pipe 18. The product recovering section 22 comprises a recovery chamber 22a which is communicated with the silicon-particle-producing chamber 18a, a filter 22b which is provided between the recovery chamber 22a and the silicon-particle-producing chamber 18a so as to separate and recover silicon particles from a fluidizing gas such as a carrier gas or a gas for plasma, and a gas suction discharge port 22c which suctions the silicon particles in the silicon-particle-producing chamber 18a together with the above fluidizing gas and suctions and discharges only the above fluidizing gas separated by the filter 22b.

The gas suction discharge port 22c is connected to a gas suction source 22d on the external top of the product recovering section 22. The fluidizing gas suctioned by the gas suction source 22*d* via the gas suction port 22*c* comprises the gas for plasma such as argon or nitrogen used for producing the thermal plasma 13 and the carrier gas such as argon for carrying the ground silicon. The fluidizing gas is sucked into the product recovering section 22 from the silicon-particle-producing chamber 18*a* together with the silicon particles. However, the particles produced in the silicon-particle-producing chamber 18*a* are recovered completely in the recovery chamber 22*a* by the filter 22*b*, and from the gas suction discharge port 22*c*, only the fluidizing gas separated by the filter 22*b* is discharged.

The ground silicon supplying device 20 is intended for supplying ground silicon to the thermal plasma 13 inside the plasma torch 12 by causing a carrier gas such as argon to carry the ground silicon and has a reserving chamber for reserving the ground silicon, a mixing chamber for causing the ground silicon reserved in the reserving chamber to be carried by the carrier gas, and a gas supply source for supplying the carrier gas to the mixing chamber. The thermal plasma treatment equipment 10 for producing silicon particles which is shown in FIG. 1 has the quartz double pipe 14 and the cooling double pipe 16 for carrying out two-step intermediate cooling, i.e., the primary cooling and the secondary cooling, between the plasma torch 12 for gasifying ground silicon and the quenching pipe 18 for quenching the gasified ground silicon so as to produce silicon particles. The thermal plasma treatment equipment 10 may be completely free from these intermediate cooling means or may have means for carrying out single-step intermediate cooling or means for carrying out intermediate cooling comprising three or more steps.

The thermal plasma treatment equipment of the present invention which carries out the thermal plasma treatment step in the production process of silicon particles is basically constituted as described above. Hereinafter, its effect and the thermal plasma treatment step for producing silicon particles will be described.

Firstly, ground silicon obtained as described above is sent to the thermal plasma treatment step and supplied to the ground silicon supplying device 20 of the thermal plasma treatment equipment 10 shown in FIG. 1. At this point, in the thermal plasma treatment equipment 10, a predetermined high frequency voltage is being applied to the high frequency transmitting coil 12*c* of the plasma torch 12, a gas for plasma supplied from the gas supply source 12*g* is being ejected from the gas ejection port 12*e*, and thermal plasma (plasma flame) 13 is being produced and retained in the plasma chamber 12*a*.

Then, when the ground silicon is supplied from the ground silicon supplying device 20 to the thermal plasma 13 which is formed in the plasma chamber 12*a* through the supply port 12*f*, the ground silicon evaporates and becomes a gas. Thus, the ground silicon gasified by the thermal plasma 13 descends from the plasma chamber 12*a* so as to get out of the thermal plasma 13, enters the cooling chamber 14*a* of the quartz double pipe 14 so as to be subjected to the primary cooling, and further descends and enters the cooling chamber 16*a* of the cooling double pipe 16 so as to be subjected to the secondary cooling.

Then, the ground silicon which has undergone the secondary cooling and been gasified or partially liquefied further descends and enters the silicon particle producing chamber 18*a* of the quenching pipe 18.

The size of the silicon particle producing chamber 18*a* is significantly larger than the size of the cooling chamber 16*a* of the cooling double pipe 16. Therefore, the gasified or partially liquefied silicon which has entered the silicon particle producing chamber 18*a* is quenched and solidified at once, whereby thermal-plasma-treated silicon particles which are finer than the ground silicon as a raw material, in other words, which have smaller particle diameters than those of the ground silicon, e.g., particle diameters of tenth to larger than twentieth, are produced.

As described above, the production method of the thermal-plasma-treated silicon particles is not limited to the two-step intermediate cooling conducted by the quartz double pipe 14 and the cooling double pipe 16. Single-step intermediate cooling or intermediate cooling comprising three or more steps may also be employed.

The production method of the thermal-plasma-treated silicon particles is basically constituted as described above.

The particle diameters of the thermal-plasma-treated silicon particles contained in the silicon-film-forming composition of the present invention can be set at any appropriate values according to a desired film thickness and the like. For example, the particle diameters may be set at preferably 0.001 to 10 μm, more preferably 0.005 to 5 μm, much more preferably 0.01 to 1 μm.

As the dispersion medium contained in the silicon-film-forming composition of the present invention, those which disperse the above silicon particles and do not react with the silicon particles are used. Illustrative examples of the dispersion medium include a hydrocarbon-based solvent such as n-pentane, n-hexane, n-heptane, n-octane, decane, dicyclopentane, benzene, toluene, xylene, durene, indene, tetrahydronaphthalene, decahydronaphthalene or squalane; an ether-based solvent such as diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran tetrahydropyran, 1,2-dimethoxyethane, bis(2-methoxyethyl)ether, p-dioxane or tetrahydrofuran; and a polar solvent such as propylene carbonate, γ-butyrolactone, N-methyl-2-pyrrolidone, dimethyl formamide and acetonitrile. Of these, the hydrocarbon-based solvent is preferred in view of the stability of the solution. These solvents may be used alone or in admixture of two or more.

The content of the silicon particles in the silicon-film-forming composition of the present invention can be set at any appropriate value according to a desired film thickness and the like. For example, the content may be set at preferably 1 to 50 wt %, more preferably 5 to 25 wt %, based on the total weight of the composition.

Although the silicon-film-forming composition of the present invention comprises the silicon particles and the dispersion medium as described above, it may also comprise at least one silane compound selected from the group consisting of a hydrogenated linear silane compound represented by a formula:

$$Si_iH_{2i+2}$$

wherein i is an integer of 2 to 8, a hydrogenated cyclic silane compound represented by a formula:

$$Si_jH_{2j}$$

wherein j is an integer of 3 to 10, and a hydrogenated basket-shaped silane compound represented by a formula:

$$Si_kH_k$$

wherein k is an even number of 6 to 10. The term "basket-shaped" refers to those including a prismane skeleton, a cubane skeleton, a pentagonal prismatic skeleton and the like.

As such a silane compound, at least one compound selected from the group consisting of cyclopentasilane, cyclohexasilane and silylcyclopentasilane is particularly preferred.

These silane compounds can be produced through decaphenylcyclopentasilane and dodecaphenylcyclopentasilane produced from diphenyldichlorosilane.

These silane compounds can be used alone or in admixture of two or more.

Such a silane compound can be used in an amount of preferably not higher than 30 wt %, more preferably not higher than 10 wt %, based on the total weight of the silicon-film-forming composition of the present invention.

To the silicon-film-forming composition of the present invention, a surfactant may also be added as required in such an amount that does not impair the object and effect of the present invention. Such a surfactant may be a cationic surfactant, an anionic surfactant, an amphoteric surfactant or a nonionic surfactant. Of these, the nonionic surfactant can be preferably used because it improves the wettability of the composition against an object to be coated, improves the leveling property of a coating film and prevents the occurrence of clods or orange skin in the coating film.

Next, a method of forming a silicon film according to the present invention will be described.

Preferred embodiments of the method of forming a silicon film according to the present invention are as follows.

(1) A method of forming a polysilicon film which comprises the steps of forming a coating film of a composition containing silicon particles and a dispersion medium on a substrate and melt-binding the coating film.

(2) A method of forming a polysilicon film which comprises the steps of forming a coating film of a composition containing silicon particles and a dispersion medium on a substrate, coating, in the presence or absence of a solvent, at least one silane compound selected from the group consisting of a hydrogenated linear silane compound represented by a formula:

$Si_iH_{2i+2}$ 

wherein i is an integer of 2 to 8, a hydrogenated cyclic silane compound represented by a formula:

$Si_jH_{2j}$ 

wherein j is an integer of 3 to 10, and a hydrogenated basket-shaped silane compound represented by a formula:

$Si_kH_k$ 

wherein k is an even number of 6 to 10, and treating the coating film with heat and/or light.

(3) A method of forming a polysilicon film which comprises the steps of forming a coating film of a composition containing silicon particles, a dispersion medium and at least one silane compound selected from the group consisting of a hydrogenated linear silane compound represented by a formula:

$Si_iH_{2i+2}$ 

wherein i is an integer of 2 to 8, a hydrogenated cyclic silane compound represented by a formula:

$Si_jH_{2j}$ 

wherein j is an integer of 3 to 10, and a hydrogenated basket-shaped silane compound represented by a formula:

$Si_kH_k$ 

wherein k is an even number of 6 to 10, on a substrate and treating the coating film with heat and/or light.

In the above embodiment (1), substrates which can be used are not particularly limited. The substrate on which the coating film is formed may have an uneven surface and is not limited to a particular shape.

Specific examples of the material of the substrate include glass, metal, plastic and ceramic. As the glass, quartz glass, borosilicate glass, soda glass, lead glass and lanthanum-based glass can be used, for example. As the metal, gold, silver, copper, nickel, silicon, aluminum, iron and stainless steel can be used, for example. As the plastic, a polyimide, a polyether sulfone, a norbornene-based ring-opened polymer and a hydrogenated norbornene-based ring-opened polymer can be used, for example. Further, these substrates may be in the shape of a block, plate, film or the like and are not limited to a particular shape.

On the above substrate, the coating film of the composition containing silicon particles and a dispersion medium can be formed by coating the composition on the substrate by an appropriate method such as spraying, roller coating, curtain coating, spin coating, wire coating, screen printing, offset printing or ink-jet printing and then removing the dispersion medium.

The coating film forming step is preferably carried out in a non-oxidizing atmosphere. Such an atmosphere can be achieved by preparing an atmosphere containing substantially no oxidizing materials such as oxygen and carbon dioxide. More specifically, a nitrogen atmosphere, a hydrogen atmosphere, a noble gas atmosphere and an atmosphere comprising a mixture of these gases can be preferably used.

In the above dispersion medium removing step, the dispersion medium may be left to stand at room temperature so as to evaporate naturally. However, the dispersion medium can be removed more effectively by heating. To heat the dispersion medium in the dispersion medium removing step, it is generally sufficient to heat the dispersion medium at a temperature of about 100 to 400° C. for about 1 to 120 minutes by use of an appropriate heating device such as an oven or a hot plate.

The thickness of the coating film varies according to the particle diameters of the silicon particles contained in the silicon-film-forming composition of the present invention. The composition can be coated such that the thickness of the coating film becomes, for example, 0.001 to 10 μm, preferably about 0.01 to 5 μm. The above film thickness should be considered as the film thickness after the dispersion medium is removed.

The thus formed coating film is then subjected to melt-binding, whereby the polysilicon film can be produced.

The melt binding refers to formation of the silicon film by melting at least surficial portions of the silicon particles contained in the coating film in a short time and binding adjacent silicon particles to one another.

Such melt binding can be achieved by irradiation of light using a YAG laser, an argon laser, a carbon dioxide gas laser and an excimer laser such as XeF, XeCl, XeBr, KrF, KrCl, ArF and ArCl as a light source in addition to discharge light of a noble gas such as argon, krypton and xenon. As these light sources, light sources with an output of 10 to 5,000 W are preferably used. An output of 100 to 1,000 W is generally sufficient. These light sources preferably have a wavelength of 170 nm to 600 nm.

Further, the melt-binding can also be achieved by emission of flashlight with a pulse width of not larger than 1.5 ms.

Irradiation of the flashlight can be carried out by use of a flashlight discharge lamp (or a flash lamp). As the flashlight discharge lamp, one formed from a quartz glass stick-shaped discharge container containing a noble gas for light emission is used, for example. As the flashlight discharge lamp, one which makes one flashlight at an electric current density of 1.5 to 3.0 kA/cm² is preferably used, for example. An example thereof is disclosed, for example, in JP-A 2001-185088. The flashlight can be irradiated one or more times. The temperature at the time of irradiation can range from −273° C. to 1,000° C., for example. Further, although the atmosphere at the time of the irradiation is not particularly limited, the irradiation is preferably made in a non-oxidizing atmosphere. As the non-oxidizing atmosphere, the same non-oxidizing atmosphere as described above can be used.

In the above embodiment (2), substrates which can be used and a method of forming the coating film of the composition containing silicon particles and a dispersion medium on the substrate are the same as those mentioned in the embodiment (1).

Then, on the above coating film, at least one silane compound selected from the group consisting of a hydrogenated linear silane compound represented by a formula:

$$Si_iH_{2i+2}$$

wherein i is an integer of 2 to 8, a hydrogenated cyclic silane compound represented by a formula:

$$Si_jH_{2j}$$

wherein j is an integer of 3 to 10, and a hydrogenated basket-shaped silane compound represented by a formula:

$$Si_kH_k$$

wherein k is an even number of 6 to 10, is coated in the presence or absence of a solvent. As the above silane compound, at least one compound selected from the group consisting of cyclopentasilane, cyclohexasilane and silylcyclopentasilane is preferred.

Solvents which can be used in coating the above silane compound are the same as the above dispersion media which can be contained in the silicon-film-forming composition of the present invention. When a solvent is used, the content of the silane compound in a solution may be 1 to 30 wt %.

Such a composition can be coated in the same manner as the composition containing silicon particles and a dispersion medium is coated in the above embodiment (1).

The silane compound is preferably coated at least in such an amount that all silicon particles are immersed in the silane compound after removal of the solvent.

The thus formed coating film is then treated with light and/or heat. Thereby, a polysilicon film can be produced.

For the above light treatment, a low-pressure or high-pressure mercury lamp, a deuterium lamp, a YAG laser, an argon laser, a carbon dioxide gas laser and an excimer laser such as XeF, XeCl, XeBr, KrF, KrCl, ArF and ArCl can be used as a light source in addition to visible light, ultraviolet light, far ultraviolet light, and discharge light of a noble gas such as argon, krypton and xenon. As these light sources, light sources with an output of 10 to 5,000 W are preferably used. An output of 100 to 1,000 W is generally sufficient. The wavelengths of these light sources may be any wavelengths as long as they can be absorbed to some extent by the polysilane compound in the coating film but are preferably 170 nm to 600 nm.

Further, the above heat treatment is carried out preferably at 100 to 1,000° C., more preferably at 200 to 850° C., much more preferably at 300 to 500° C. The heating time in the heat treatment is preferably 10 to 120 minutes, more preferably 15 to 60 minutes.

The above light treatment and/or heat treatment are/is carried out preferably in a non-oxidizing atmosphere, more preferably in a nitrogen atmosphere, an argon atmosphere, a hydrogen-containing argon atmosphere or a hydrogen-containing nitrogen atmosphere.

In the above embodiment (3), substrates which can be used are the same as those mentioned in the above embodiment (1).

The composition containing silicon particles, a dispersion medium and at least one silane compound selected from the group consisting of a hydrogenated linear silane compound represented by a formula:

$$Si_iH_{2i+2}$$

wherein i is an integer of 2 to 8, a hydrogenated cyclic silane compound represented by a formula:

$$Si_jH_{2j}$$

wherein j is an integer of 3 to 10, and a hydrogenated basket-shaped silane compound represented by a formula:

$$Si_kH_k$$

wherein k is an even number of 6 to 10, can be coated on a substrate so as to form the coating film in the same manner as the composition containing silicon particles and a dispersion medium is coated in the above embodiment (1).

The thus formed coating film is then treated with light and/or heat. Thus, a polysilicon film can be produced. The treatment with light and/or heat can be carried out under the same conditions as those used in the above embodiment (2).

Hereinafter, the present invention will be further described by use of examples. The present invention shall not be limited by these examples in any way.

EXAMPLES

A grid peeling test in Examples was carried out in the following manner, and resistivity in Examples was measured in the following manner.

Adhesion (Grid Peeling Test):

A grid peeling test was carried out in accordance with JIS K-5400 so as to evaluate adhesion. The number of grids on which a silicon film remained out of 100 grids was recorded.

Resistivity:

The resistivity of a silicon film was measured by use of a resistivity measuring device "Σ-5" of NPS Co., Ltd. The average of values measured at 10 different spots on the same silicon film was taken as resistivity.

Synthesis Example 1

The inside of a 3-liter four-neck flask equipped with a thermometer, a cooling condenser, a dropping funnel and an agitator was substituted with an argon gas. Then, 1 liter of dried tetrahydrofuran and 18.3 g of lithium metal were charged into the flask and bubbled with an argon gas.

While this suspension was being stirred at 0° C., 333 g of diphenyldichlorosilane was added through the dropping funnel. After completion of the addition, the suspension was further stirred at room temperature for 12 hours until the lithium metal disappeared completely. The reaction mixture was poured into 5 liters of ice water and precipitated. This precipitate was separated by filtration, rinsed well with water, then rinsed with cyclohexane and then vacuum-dried so as to obtain 140 g of white solid. Then, 100 g of the white solid and 1,000 ml of dried cyclohexane were charged into a 2-liter flask, 4 g of aluminum chloride was added, and the resulting mixture was bubbled with a dried hydrogen chloride at room temperature for 8 hours while the mixture was being stirred.

Meanwhile, 40 g of aluminum lithium hydride and 400 ml of diethyl ether were charged into a 3-liter flask, the above reaction mixture was added thereto in an argon atmosphere at 0° C. under agitation, and the resulting mixture was stirred at the same temperature for 1 hour and then stirred at room temperature for another 12 hours.

After removal of by-products from the reaction mixture, the resulting reaction mixture was subjected to vacuum distillation at 70° C. and 10 mmHg. Thereby, 10 g of colorless liquid was obtained. This liquid was determined to be cyclopentasilane from IR, $^1$H-NMR, $^{29}$Si-NMR and GC-MS spectra. 10 g of this cyclopentasilane was charged into a 100-ml flask, exposed to a 500-W high-pressure mercury lamp for 20 minutes in an argon atmosphere under agitation, and then diluted with 90 g of xylene. As a result, a white precipitate was produced. The precipitate was filtered so as to prepare a xylene-soluble silane-based coating solution.

Synthesis Example 2

Silicon powder with an average particle diameter of 8 mm which had been obtained by dry-grinding a silicon monocrystalline ingot (resistivity: $2\times10^3$ Ωcm) was further charged into a stainless steel ball mill and dry-ground in a nitrogen atmosphere at room temperature for 8 hours so as to obtain silicon fine particles having an average particle diameter of 5 μm. The thus obtained silicon fine particles having an average particle diameter of 5 μm was rinsed with 1% hydrofluoric acid and then with ion exchanged water and then vacuum-dried at 30° C.

Then, silicon particles were produced by use of the thermal plasma treatment equipment 10 shown in FIG. 1. In the thermal plasma treatment equipment 10 of FIG. 1, the sizes of the quartz pipe 12*b* of the plasma torch 12, the quartz pipe 14*b* of the quartz double pipe 14, the inner pipe 16*b* of the cooling double pipe 16 and the inner pipe 18*b* of the quenching pipe 18 were 55 mm in internal diameter and 220 mm in length, 120 mm in internal diameter and 250 mm in length, 120 mm in internal diameter and 100 mm in length and 400 mm in internal diameter and 900 mm in length, respectively.

Further, a high frequency voltage of about 4 MHz and 6 kV was applied to the high frequency transmitting coil 12*c* of the plasma torch 12, and as a gas for plasma ejected from the gas ejection port 12*e*, a mixed gas comprising 100 liters/min of argon and 10 liters/min of hydrogen was used.

At this time, the atmosphere of the thermal plasma 13 formed in the plasma chamber 12*a* of the plasma torch 12 was a reduced-pressure atmosphere of about 450 Torr. Further, the ground silicon was carried by 5 liters/min of argon which was a carrier gas from the supply port 12*f* of the plasma torch 12 and supplied into the thermal plasma 13 at a rate of 10 g/h. Further, the atmosphere inside the silicon-particle-producing chamber 18*a* of the quenching pipe 18 was a reducing atmosphere comprising hydrogen-containing argon.

The thus produced silicon particles had an average particle diameter of 0.3 μm.

Synthesis Example 3

Silicon powder with an average particle diameter of 9 mm which had been obtained by dry-grinding polycrystalline silicon (resistivity: $3.3\times10^3$ Ωcm) was further charged into a stainless steel ball mill and dry-ground in a nitrogen atmosphere at room temperature for 8 hours so as to obtain silicon fine particles having an average particle diameter of 6 μm. The thus obtained silicon fine particles having an average particle diameter of 6 μm was rinsed with 1% hydrofluoric acid and then with ion exchanged water and then vacuum-dried at 30° C.

Then, silicon particles were produced in the same manner as in Synthesis Example 2 by use of the thermal plasma treatment equipment shown in FIG. 1.

The thus produced silicon particles had an average particle diameter of 0.1 μm.

Example 1

Silicon powder with an average particle diameter of 100 μm which had been obtained by dry-grinding a silicon monocrystalline ingot (resistivity: $2\times10^3$ Ωcm) was rinsed with aqua regia and then with 1% hydrofluoric acid. Thereafter, 60 g of the rinsed silicon, 340 g of deaerated xylene and 60 g of $CCl_4$ were charged into a bead mill made of silicon nitride and wet-ground in a nitrogen atmosphere at 60° C. for 50 minutes so as to obtain a xylene dispersion of silicon fine particles having an average particle diameter of 0.15 μm. This dispersion was coated on a glass substrate by use of a wire coater in a nitrogen atmosphere and then dried at 200° C. for 30 minutes so as to form a film composed of the silicon fine particles. Then, on this coating film, the above coating solution obtained in Synthesis Example 1 was coated by use of a dip coater, dried at 200° C. for 30 minutes, and sintered at 400° C. for 30 minutes so as to bind the silicon fine particles to one another. The thus obtained silicon film had a film thickness of 5.4 μm. When a grid peeling test was conducted for the adhesion of the silicon film, the silicon film remained in all of 100 grids. Further, as a result of XRD analysis of the silicon film, it was found that the silicon showed peaks attributed to (111) at 28.5°, (220) at 47.4°, (311) at 56.3° and (400) at 69.3° and was a polycrystal. Further, as a result of ESCA analysis, a peak attributed to metal Si was observed at 99 eV. The resistivity of this silicon film was $1.5\times10^4$ Ωcm.

Example 2

A silicon film having a thickness of 5.8 μm was formed in the same manner as in Example 1 except that an n-type ingot (resistivity: 0.1 Ωcm) doped with a phosphorus atom at a concentration of $10^{17}$ atom/cm$^3$ was used in place of the silicon monocrystalline ingot used in Example 1. The results of evaluations of the adhesion and resistivity of the obtained silicon film are shown in Table 1.

Example 3

A silicon film having a thickness of 5.6 μm was formed in the same manner as in Example 1 except that a p-type ingot (resistivity: 0.5 Ωcm) doped with a boron atom at a concentration of $10^{18}$ atom/cm$^3$ was used in place of the n-type ingot used in Example 2. The results of evaluations of the adhesion and resistivity of the obtained silicon film are shown in Table 1.

Example 4

As in Example 1, silicon powder with an average particle diameter of 100 μm which had been obtained by dry-grinding a silicon monocrystalline ingot (resistivity: $2\times10^3$ Ωcm) was rinsed with aqua regia and then with 1% hydrofluoric acid. Then, 60 g of the rinsed silicon, 340 g of deaerated xylene and 60 g of $CCl_4$ were charged into a bead mill made of silicon nitride and then wet-ground in a nitrogen atmosphere at 60° C. for 50 minutes so as to obtain a xylene dispersion of silicon fine particles having an average particle diameter of 0.15 µm. This dispersion was coated on a glass substrate by use of a wire coater in a nitrogen atmosphere and then dried at 200° C. for 30 minutes so as to form a film composed of the silicon fine particles. Then, the silicon film was exposed to 3,700 J/m$^2$ of an XeCl excimer laser beam having a wavelength of 308 nm so as to melt-bind the silicon fine particles together. The results of a grid peeling test conducted for the adhesion of the silicon film (film thickness: 5.3 µm) exposed to the laser beam and an evaluation of the resistivity of the silicon film are shown in Table 1.

Example 5

A film composed of silicon fine particles was exposed to 300,000 J/m$^2$ of flash lamp containing a xenon gas at a pulse width of 0.5 mS in place of the XeCl excimer laser of Example 4 so as to melt-bind the silicon fine particles together. The results of a grid peeling test conducted for the adhesion of the silicon film (film thickness: 5.5 µm) exposed to the laser beam and an evaluation of the resistivity of the silicon film are shown in Table 1.

Example 6

Silicon powder with an average particle diameter of 100 µm which had been obtained by dry-grinding a silicon monocrystalline ingot (resistivity: 2×10$^3$ Ωcm) was rinsed with aqua regia and then with 1% hydrofluoric acid. Then, 60 g of the rinsed silicon, 400 g of deaerated toluene and 10 g of AIBN were charged into a bead mill made of zirconia and then wet-ground in a nitrogen atmosphere at 75° C. for 50 minutes so as to obtain a xylene dispersion of silicon fine particles having an average particle diameter of 0.16 µm. To 100 g of this dispersion was added 10 g of the silane solution of Synthesis Example 1 so as to prepare a mixed dispersion comprising the silicon fine particles and silane. This dispersion was coated on a norbornene-based polymer substrate in a nitrogen atmosphere by use of a bar coater, dried at 200° C. for 30 minutes and then sintered at 300° C. for 30 minutes. The thickness of the obtained silicon film was 8.5 µm. The results of evaluations of the adhesion and resistivity of the silicon film are shown in Table 1.

Example 7

Silicon powder with an average particle diameter of 100 µm which had been obtained by dry-grinding a silicon monocrystalline ingot (resistivity: 2×10$^3$ Ωcm) was rinsed with aqua regia and then with 1% hydrofluoric acid. Then, 30 g of the rinsed silicon, 270 g of deaerated xylene and 30 g of CCl$_4$ were charged into a bead mill made of silicon nitride and then wet-ground in a nitrogen atmosphere at 60° C. for 20 minutes so as to obtain a xylene dispersion of silicon fine particles having an average particle diameter of 0.15 µm. To 95 g of this dispersion was added 5 g of the silane solution obtained in Synthesis Example 1 so as to prepare a coating solution. This coating solution was coated on a quartz substrate in a nitrogen atmosphere by use of a bar coater and then sintered at 200° C. for 30 minutes. Further, the silane solution of Synthesis Example 1 was spin-coated on the silicon film at 2,000 rpm and then sintered at 300° C. for 30 minutes. The thickness of the obtained silicon film was 65 µm. The results of evaluations of the adhesion and resistivity of the silicon film are shown in Table 1.

Example 8

Silicon powder with an average particle diameter of 100 µm which had been obtained by dry-grinding a silicon monocrystalline ingot (resistivity: 2×10$^3$ Ωcm) was rinsed with aqua regia and then with 1% hydrofluoric acid. Then, 60 g of the rinsed silicon and 400 g of ultrapure water were charged into a bead mill made of zirconia and then ground at 60° C. for 60 minutes. Silicon and water reacted with each other during grinding, and the occurrence of a hydrogen gas was observed. The average particle diameter of the ground silicon was 0.2 µm. This dispersion was dip-coated on a borosilicate glass substrate and sintered at 250° C. for 30 minutes so as to obtain a 20-µm-thick silicon film having metallic gloss. The results of evaluations of the adhesion and resistivity of the silicon film are shown in Table 1.

Example 9

Silicon powder with an average particle diameter of 8 mm which had been obtained by dry-grinding a silicon monocrystalline ingot (resistivity: 2×10$^3$ Ωcm) was further charged into a stainless steel ball mill and dry-ground in a nitrogen atmosphere at room temperature for 12 hours so as to obtain silicon fine particles having an average particle diameter of 1.5 µm. The thus obtained silicon fine particles having an average particle diameter of 1.5 µm was rinsed with 1% hydrofluoric acid and then with ion exchanged water and then vacuum-dried at 30° C.

To 5 g of the particles, 5 g of the coating solution prepared in Synthesis Example 1 and 20 g of toluene were added, and the mixed solution was coated by use of a dip coater and sintered at 400° C. for 30 minutes so as to form a silicon film having a thickness of 7 µm. The results of evaluations of the adhesion and resistivity of the silicon film are shown in Table 1.

TABLE 1

| | Adhesion (Number of Grids where Silicon Film Remained in Grid Peeling Test) | Resistivity Ωcm |
|---|---|---|
| Example 2 | 100 | $1.5 \times 10^2$ |
| Example 3 | 100 | $8.1 \times 10^2$ |
| Example 4 | 100 | $5.1 \times 10^4$ |
| Example 5 | 100 | $2.3 \times 10^4$ |
| Example 6 | 100 | $7.2 \times 10^5$ |
| Example 7 | 100 | $4.5 \times 10^7$ |
| Example 8 | 100 | $8.5 \times 10^{13}$ |
| Example 9 | 100 | $4.0 \times 10^2$ |

Example 10

60 g of the silicon particles obtained in Synthesis Example 2 were dispersed in 340 g of deaerated xylene. This dispersion was coated on a glass substrate in a nitrogen atmosphere by use of a wire coater and dried at 200° C. for 30 minutes so as to form a film composed of the silicon particles.

Then, on this film, the coating solution obtained in Synthesis Example 1 was spin-coated, dried at 200° C. for 30 minutes and then sintered at 400° C. for 30 minutes so as to bind the silicon particles together. The thickness of the thus obtained silicon film was 3.1 µm. When a grid peeling test was carried out for the adhesion of the silicon film, the silicon film remained in all of 100 grids. Further, as a result of XRD analysis, it was found that the silicon showed peaks attributed to (111) at 28.5°, (220) at 47.4°, (311) at 56.3° and (400) at 69.3° and was a polycrystal. Further, as a result of ESCA analysis, a peak attributed to metal Si was observed at 99 eV. The resistivity of this silicon film was 2.9×10³ Ωcm.

Example 11

A silicon film prepared from a xylene dispersion of silicon particles having an average particle diameter of 0.1 μm in the same manner as in Example 10 was exposed to 3,700 J/m² of XeCl excimer laser beam having a wavelength of 308 nm so as to melt-bind the silicon particles together.

The results of an adhesion test (grid peeling test) conduced on the silicon film (film thickness: 3.9 μm) exposed to the laser beam and an evaluation of the resistivity of the silicon film are shown in Table 2.

Example 12

A silicon film prepared from a xylene dispersion of silicon particles having an average particle diameter of 0.1 μm in the same manner as in Example 10 was exposed to 300,000 J/m² of flash lamp containing a xenon gas at a pulse width of 0.5 mS in place of the XeCl excimer laser so as to melt-bind the silicon particles together. The results of an adhesion test (grid peeling test) conducted for the silicon film (film thickness: 3.4 μm) exposed to the laser beam and an evaluation of the resistivity of the silicon film are shown in Table 2.

Example 13

To 5 g of silicon particles with an average particle diameter of 0.1 μm prepared in the same manner as in Synthesis Example 2, 5 g of the silane solution prepared in Synthesis Example 1 was added so as to prepare a mixed dispersion comprising the silicon particles and silane. This dispersion was coated on a norbornene-based polymer substrate in a nitrogen atmosphere by use of a bar coater, dried at 200° C. for 30 minutes and then sintered at 300° C. for 30 minutes. The thickness of the obtained silicon film was 4.1 μm. The results of an adhesion test (grid peeling test) conducted on the silicon film and an evaluation of the resistivity of the silicon film are shown in Table 2.

Example 14

As in Example 10, a xylene dispersion of silicon particles having an average particle diameter of 0.1 μm was coated on a quartz substrate in a nitrogen atmosphere by use of a bar coater and sintered at 200° C. for 30 minutes. Further, the silane solution of Synthesis Example 1 was spin-coated on the silicon film at 2,000 rpm and then sintered at 300° C. for 30 minutes. The thickness of the obtained silicon film was 60 μm. The results of an adhesion test (grid peeling test) conducted on the silicon film and an evaluation of the resistivity of the silicon film are shown in Table 2.

Example 15

60 g of the silicon particles obtained in Synthesis Example 3 were dispersed in 340 g of deaerated xylene. This dispersion was coated on a glass substrate in a nitrogen atmosphere by use of a wire coater and dried at 200° C. for 30 minutes so as to form a film composed of the silicon particles.

Then, on this film, the coating solution obtained in Synthesis Example 1 was spin-coated, dried at 200° C. for 30 minutes and then sintered at 400° C. for 30 minutes so as to bind the silicon particles together. The thickness of the thus obtained silicon film was 3.7 μm. As a result of XRD analysis, it was found that the silicon showed peaks attributed to (111) at 28.5°, (220) at 47.4°, (311) at 56.3° and (400) at 69.3° and was a polycrystal. The results of an adhesion test (grid peeling test) conducted on the silicon film and an evaluation of the resistivity of the silicon film are shown in Table 2.

TABLE 2

|  | Adhesion (Grid Peeling Test) | Resistivity Ωcm |
| --- | --- | --- |
| Example 11 | 100 | $6.2 \times 10^4$ |
| Example 12 | 100 | $4.7 \times 10^4$ |
| Example 13 | 100 | $4.2 \times 10^5$ |
| Example 14 | 100 | $5.5 \times 10^4$ |
| Example 15 | 100 | $7.9 \times 10^4$ |

As described above, according to the present invention, a composition and method for forming a polysilicon film having a desired film thickness efficiently and easily are provided.

The invention claimed is:

1. A silicon-film-forming composition comprising silicon particles and a dispersion medium, wherein the silicon particles are obtained by gasifying ground silicon in a thermal plasma followed by quenching, the composition further comprising at least one silane compound selected from the group consisting of:

a hydrogenated linear silane compound represented by the following formula:

$$Si_iH_{2i+2}$$

wherein i is an integer of 2 to 8, a hydrogenated cyclic silane compound represented by the following formula:

$$Si_jH_{2j}$$

wherein j is an integer of 3 to 10, and a hydrogenated basket-shaped silane compound represented by the following formula:

$$Si_kH_k$$

wherein k is an even number of 6 to 10.

2. The composition of claim 1, wherein the silicon particles are crystalline.

3. The composition of claim 1 or 2, wherein the silicon particles are i-type.

4. A method for forming a polysilicon film, which comprises forming a coating film of the composition of claim 1 on a substrate and then melting and binding the coating film.

5. The composition of claim 1 or 2, wherein the silicon particles are p-type.

6. The composition of claim 1 or 2, wherein the silicon particles are n-type.

7. The composition of claim 1, wherein the silicon particles have a particle diameter of 0.001 to 10 μm.

8. The composition of claim 1, wherein the silicon particles have a particle diameter of 0.005 to 5 μm.

9. The composition of claim 1, wherein the particles have a particle diameter of 0.01 to 1 μm.

10. The composition of claim 1, wherein the content of the silicon particles in the silicon-film-forming composition is 1 to 50 wt % based on the total weight of the composition.

11. The composition of claim 1, wherein the dispersion medium comprises at least one solvent selected from the group consisting of n-pentane, n-hexane, n-heptane, n-octane, decane, dicyclopentane, benzene, toluene, xylene, durene, indene, tetrahydronaphthalene, decahydronaphthalene, squalane, diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1,2-dimethoxyethane, bis(2-methoxyethyl)ether, p-dioxane, propylene carbonate, γ-butyrolactone, N-methyl-2-pyrrolidone, dimethyl formamide and acetonitrile.

12. A method for forming a polysilicon film, which comprises forming a coating film of a composition comprising silicon particles and a dispersion medium, wherein the silicon particles are obtained by gasifying ground silicon in a thermal plasma followed by quenching, on a substrate, coating at least one silane compound selected from the group consisting of a hydrogenated linear silane compound represented by the following formula:

$$Si_iH_{2i+2}$$

wherein i is an integer of 2 to 8, a hydrogenated cyclic silane compound represented by the following formula:

$$Si_jH_{2j}$$

wherein j is an integer of 3 to 10, and a hydrogenated basket-shaped silane compound represented by the following formula:

$$Si_kH_k$$

wherein k is an even number of 6 to 10, on the coating film in the presence or absence of a solvent, and treating the resulting coating film with heat and/or light.

* * * * *